United States Patent [19]

Jaeger et al.

[11] 4,262,035

[45] Apr. 14, 1981

[54] MODIFIED CHEMICAL VAPOR DEPOSITION OF AN OPTICAL FIBER USING AN RF PLASMA

[75] Inventors: Raymond E. Jaeger, Basking Ridge; John B. MacChesney, Stirling; Thomas J. Miller, Greenbrook, all of N.J.

[73] Assignee: Bell Telephone Laboratories, Incorporated, Murray Hill, N.J.

[21] Appl. No.: 128,094

[22] Filed: Mar. 7, 1980

Related U.S. Application Data

[63] Continuation of Ser. No. 861,838, Dec. 19, 1977, abandoned, which is a continuation of Ser. No. 670,162, Mar. 25, 1976, abandoned.

[51] Int. Cl.³ .............................................. B05D 3/06
[52] U.S. Cl. ..................................... 427/39; 427/45.1; 427/47; 427/237; 427/238; 427/376.2
[58] Field of Search ................ 427/45.1, 47, 237, 238, 427/376.2, 39; 219/10.55 R, 10.55 M

[56] References Cited

FOREIGN PATENT DOCUMENTS 2328930 1/1974 Fed. Rep. of Germany.

Primary Examiner—Bernard D. Pianalto
Attorney, Agent, or Firm—Samuel H. Dworetsky

[57] ABSTRACT

The modified chemical vapor deposition process is practiced using an rf source as the external heat source. An rf plasma is thus established within a glass tube through which appropriate glass precursor vapors are passed. As a result of the ensuing chemical reactions, particulate material is formed within the tube and deposits on it. The hot plasma zone may be used to consolidate this particulate material into a transparent glass, and onto the interior wall of the tube. The tube is subsequently drawn into an optical fiber.

10 Claims, 3 Drawing Figures

MODIFIED CHEMICAL VAPOR DEPOSITION OF AN OPTICAL FIBER USING AN RF PLASMA

This is a continuation of application Ser. No. 861,838 filed Dec. 19, 1977, which is a continuation of application Ser. No. 670,162 filed Mar. 25, 1976, both now abandoned.

BACKGROUND OF THE INVENTION

1. Field of the Invention

This invention is a technique for fabricating optical fibers.

2. Description of the Prior Art

The central problem in the fabrication of optical fibers of sufficient quality for use in long distance transmission systems involves the reduction of optical losses to tolerable levels—usually less than 10 db/km. The purity required for such low loss qualities is achieved by means of sophisticated deposition techniques used in fabricating the preforms from which the optical fibers are drawn.

There are currently two major techniques appropriate for commercial fabrication of optical fiber preforms—the "soot deposition" process, and the modified chemical vapor deposition technique (MCVD). Both of these processes involve the thermochemical production of glass from appropriate glass precursor vapors.

In the soot depositin technique, disclosed in U.S. Pat. Nos. 3,826,560 and 3,823,995, the glass precursor vapors are introduced into a hydrolyzing flame. In the ensuing reaction, particulate material—commonly referred to as soot—is formed. The stream of particulate material emanating from the flame is then directed toward a mandril, which may be, for example, a tube or a glass rod, to which the soot adheres. Following the deposition, the soot is consolidated into a transparent glass, the mandril may be removed, and the preform is drawn into a fiber. Although deposition rates using this technique are rapid, the nature of the flame reaction is such that the presence of impurities, particularly the hydroxyl radical, is a recurring problem.

The hydroxyl impurity problem, which is prevalent in the soot technique, may be more effectively limited in the various chemical vapor deposition techniques (CVD). In the simple CVD process, a stream of glass precursor vapors is directed through the center of a glass tube. The tube is usually composed of a glass material which may be appropriate for use as a cladding in the fiber. The tube is heated, causing the gas vapors to react at the walls of the tube—a heterogeneous reaction—forming directly an appropriate glass. The absence of a flame, and its associated hydroxyl impurities, accounts, in part, for the high glass purities and low optical losses obtained using the CVD technique. However, the CVD processes are normally too slow for practical commercial applications.

An invention which allows for the practical commercial application of a chemical vapor deposition process is described in a commonly-assigned application Ser. No. 444,705. In that application, it is shown that if the reactant concentration and the temperature to which the tube is heated are raised sufficiently above that which is normally encountered in the conventional CVD process, a new and more efficient process takes place—the modified chemical vapor deposition process (MCVD). Under these circumstances, the glass precursor vapor may be transformed into both a vitreous phase on the glass walls—a heterogeneous reaction—and a particulate phase in the center of the tube away from the walls—a homogeneous reaction. The particulate material "falls out" onto the tube walls and is consolidated into a glass, and onto the tube, as the heated zone traverses the length of the tube. This process has a much more rapid deposition rate than the simple CVD process. The impurities associated with the ignition, present in the hydrolysis burner of the soot technique, are not a consideration in the MCVD process. It is found that the integrity of the tube may be maintained throughout the MCVD process despite the high temperatures required for its effective implementation.

SUMMARY OF THE INVENTION

In this invention the modified chemical vapor deposition process is practiced using an rf source as the external heat source. Under these circumstances, an rf plasma is formed within a glass tube, on the interior of which additional glass is to be deposited. Glass precursor vapors are passed through the tube as before, and the plasma causes complicated chemical reactions to ensue. Despite the very high temperature of the plasma, glass particulate material is produced. This species of the modified chemical vapor deposition process proceeds with higher deposition efficiency and speed than when the usual heat source is used. At the same time glass with high purity, such as that normally associated with the conventional CVD process, is produced. Doped glasses, required in certain types of optical fibers, may also be deposited using this technique.

DETAILED DESCRIPTION

Figure 1:
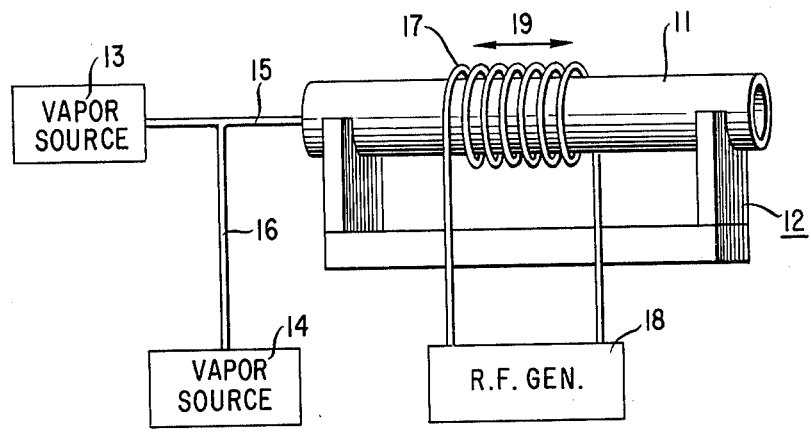
FIG. 1 is a schematic representation of an apparatus which may be utilized in the practice of this invention, and in which the radio frequency electromagnetic wave energy is inductively coupled into the plasma.

1. The Modified Chemical Vapor Deposition Process

The modified chemical vapor deposition process is a recently-disclosed improvement in the chemical vapor deposition of glass for subsequent fabrication into an optical fiber. Such an optical fiber generally has a core section of higher index of refraction than the surrounding cladding. At least some of the glass deposited on the interior of a glass tube, using the MCVD process, will ultimately form the high index core of the fiber, while the glass tube may form the cladding. The MCVD process is disclosed in a commonly-assigned application Ser. No. 444,705 which is incorporated by reference into this application.

In the modified chemical vapor deposition process a rotating glass tube, through which glass precursor vapors are flowed, is heated to temperatures in excess of approximately 1300 degrees C. Such heating is greater than that encountered in normal chemical vapor deposition processes. When exposed to such heat the chemical processes that occur within the tube are found to yield both glass particulate matter, which is formed within the central region of the tube and away from the tube walls, and the more common vitreous deposit, formed directly on the tube walls. The particulate material falls onto the glass tube and is consolidated by the hot zone. Glass produced in such a manner is of the same high purity as that produced in the standard CVD processes, but is fabricated much more rapidly.

In the process described in this application the usual external heat source of the MCVD technique—a ring of flame burners—is replaced with an rf source, which in a specific embodiment is an rf coil. As a result of this source, an rf plasma is established within the tube, through which additional plasma supporting gases may be passed along with the glass precursor vapors. The resultant chemistry, though usually occurring at a much higher temperature than the previously-disclosed MCVD process, also yields glass particulate matter which falls onto the tube and may be consolidated, simultaneously or separately, by means of the coil produced plasma heat.

2. The Plasma Chemistry

The interdependence of the numerous plasma phenomena makes it difficult to rigorously analyze a plasma in terms of isolated individual phenomena. However, the independent consideration of at least three isolated plasma phenomena, though by the isolated nature of the analysis inaccurate, will nevertheless help to place the invention in a more reasonable perspective.

The first basic phenomenon involves the free electron velocity distribution within the plasma. The free electron velocity distribution has a mean absolute value which is inversely proportional to the frequency of the supporting electromagnetic energy. Consequently, a lower frequency rf plasma may have higher velocity electrons than a higher frequency microwave plasma. Clearly, chemical reactions requiring higher activation energies may occur in an rf plasma while they might not occur in the microwave plasma. This simple consideration of the electron velocity distribution is essentially exact in a collisionless plasma. However, the collisions that occur in most plasmas may alter the electron velocity distribution and hence render an exact analysis more difficult.

The second phenomenon involves the collisional transfer of energy within the plasma. The higher the probability of such collisional transfer, the greater the likelihood that various reactions will take place. First principles indicate that when the pressure in the plasma is raised so that the electron collision frequency approaches the frequency of the supporting electromagnetic energy, a region will be reached where energy will be more efficiently transferred between the various gases present in the plasma and the electrons. Since the rf plasma is maintained by a lower frequency electromagnetic wave than the microwave plasma, such efficient energy transfer will commence at lower pressures in the rf plasma than in the microwave plasma. In view of the above two phenomena, the lower frequency rf plasma will apparently have higher velocity electrons and the possibility of more efficient energy transfer among the gaseous constituents than the higher frequency microwave plasma.

An additional consideration involves the reflective properties of the plasma. Generally electromagnetic energy of frequency lower than the plasma frequency—a parameter of the plasma directly related to its charge density—will be reflected off the plasma rather than transmitted into it. Consequently, when supporting a plasma with electromagnetic wave energy of a given frequency it is clear that the charge density of the plasma must remain below a specified upper bound, and that this charge density will be lower for rf plasmas than for microwave plasmas.

Two characteristics, from the many which serve to distinguish between an rf and a microwave plasma, are consequently seen to be the potentially higher electron temperature of the rf plasma and its lower charge density. The temperature within an rf plasma may be so high that most materials can only exist in the plasma in vapor form. In addition the lower charge density might serve to limit the ensuing plasma ion chemistry. Despite this, applicants have shown that in an rf plasma chemical reactions occur which efficiently transform glass percursor vapors into glass particulate material. The particulate material deposits on the inner walls of a glass tube which surrounds the plasma and may be consolidated with this tube by the high temperature plasma. The rf plasma has been shown to be among the most efficient ways of practicing the modified chemical vapor deposition technique. In this specific process the rate of transforming chemical reactants to deposited glass surpasses that of the conventional MCVD process. The reaction rates may be further increased when the plasma supporting medium and the associated glass precursor vapors are maintained at a positive pressure within a partially sealed tube as they flow through the tube.

The rf plasma MCVD process, as a species of the generic MCVD process, is a totally different chemical process than the presently practiced microwave plasma CVD process. In the rf plasma process particulate material is formed homogeneously, at least in part, and is deposited on a glass tube wall. If a microwave plasma process is used such homogeneous particulate formation is generally not present. It is not clear from the microwave technique that the higher temperature and the relatively low charge density of the rf plasma will allow for particulate formation.

While the process, as described, utilizes an rf coil surrounding a glass tube to inductively couple energy into the plasma, other coupling techniques may be utilized. For example, the radio frequency generated electron beam torch described in U.S. Pat. No. 3,648,015 may be utilized in such a manner that the plasma, while formed by an external rf coil, is directly injected into the tube by means of the electron beam torch.

3. Operating Parameters

The specific parameters necessary to obtain particulate formation using the rf plasma technique described above are critically interdependent and consequently a partial list of parameter values will not be meaningful. However, the range of parameters may be specified and the subsequent determination of the exact parameters required for a particular embodiment may be obtained in the obvious ways known to those skilled in the plasma art. With this proviso, ranges of the operating parameters may be specified.

A typical rf plasma MCVD apparatus is shown in FIG. 1. The glass tube 11, which may ultimately form the fiber cladding, is placed in a glass lathe 12 or any other appropriate supporting device. The diameter of the tube is generally not limited by any inherent properties associated with the instant invention; however, for practical purposes the glass tube is usually of internal diameter from about 5 mm to about 30 mm with a wall thickness of from about 0.5 mm to about 5 mm. Glass precursor vapors, for example halides or hydrides of Si, Ge, B, Sn, Sb, P, Ta, Nb, Zr, Ti, Al, As or combinations thereof, are produced at 13 and introduced into the tube tangentially, axially, or radially at 15. The vapors may be produced at 13 by bubbling an appropriate carrier gas such as oxygen through a liquid bath of the exemplary halides or hydrides. Clearly, if the exemplary halides or hydrides exist in a gaseous phase at room temperature, they may be directly injected into the tube without the need for a bubbler. If oxygen is used as a carrier gas it may simultaneously serve as a reactant in the subsequent chemical process, so that the requisite oxidic glass particulate material results. However, numerous other nonreactive carrier gases may be used, in which case an oxidizing gas must be supplied to yield the requisite oxidation chemistry. The glass precursor vapors are generally flowed through the tube at a rate of from 0.1 to 1000 liters/minute.

If an oxydizing gas is used as the carrier gas, it may also act to support the plasma. However, other plasma supporting gases may be used instead of, or in addition to, the carrier gas. Exemplary plasma supporting gases are Ar, Kr, He, $N_2$ and $H_2$. They are supplied at 14, and introduced into the tube at 16. The various gases may be premixed before being introduced into the tube, as shown, or may be inserted directly into the tube without prior mixing. Enhanced uniformity in the composition of the deposited glass may be effected by means of a diffuser acting on the injected gases.

In FIG. 1, 17 is an appropriate rf coil energized by means of a standard rf generator at 18. The coil, though shown shaped as a solenoid, may be of any appropriate design. Alternatively, other rf sources might be utilized. The frequency of the electromagnetic wave energy used in the practice of this invention is in the radio frequency range, generally defined as extending from about 1 KHz to about 100 MHz but is typically a few MHz. Typical power values are within the range of from 5 to 50 kw. Once the coil is energized, the plasma may be initiated in the standard manner by means of a tesla coil. In FIG. 1 the energy supplied by the generator to the coil is inductively coupled into the plasma by means of the rf coil. The coil may extend over a substantial part of the tube, but for most effective deposition a coil of limited extent is used and is caused to move relative to the tube by a means, 19, which supplies relative motion between the coil and the tube. Traversal rates of from 6 to 3000 cm/min are most commonly used and, depending on the reaction kinetics, the deposition rate and the amount of deposited material required, one or more traversals may be needed. The integrity of the tube may be ensured, despite the high plasma temperature, by rotating it during deposition. Additionally, a stream of cool air may be directed toward the outside of the tube during the deposition to further ensure its integrity.

A number of variations on the above technique may serve to broaden its applicability. So, for example, the technique may be used to deposit multicomponent doped glasses as well as pure glasses. The dopant concentration may be varied during the deposition process to yield a tubular glass of radially varying composition. Such a deposit will ultimately form the core of a graded index optical fiber. Additional benefits may accrue to the practitioner if an external magnetic field is used to confine the plasma to a predetermined region of the tube. For example, it may be beneficial to confine the plasma to the central region of the tube, away from the walls, using such a magnetic field. Another variation centers about the specified utilization of a single heat source to accomplish both the particulate formation and consolidation. The invention, however, is not limited to a single heat source. Rather, the plasma source might be used for particulate production while an external conventional heat source might be used for consolidation.

While the above description calls for flowing the precursor vapors through an open glass tube, the invention is not so limited. Alternatively, the tube may be at least partially sealed and the precursor vapors may be supplied to the sealed tube in such a manner that the pressure within the tube is above atmospheric pressure. Such high pressure may result in more rapid reaction processes and, consequently, more rapid deposition rates.

After deposition, the tube may be collapsed to a solid preform and drawn into a fiber, or drawn directly into a fiber, using, for example, the well-known oven or laser drawing techniques.

Figure 2:
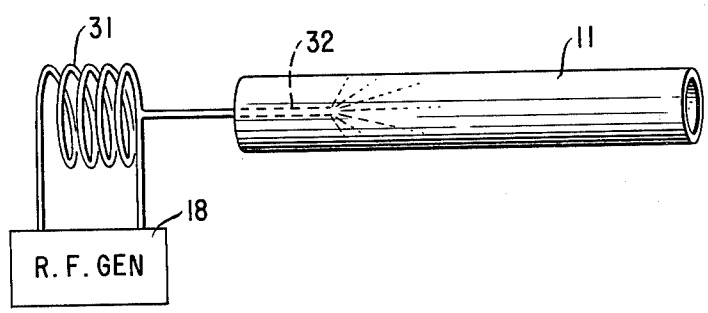
FIG. 2 is a schematic representation of an apparatus in which the electromagnetic energy is directly coupled into the plasma, and the plasma is directly inserted into the reaction region by means of a single electron beam torch nozzle.
Figure 3:
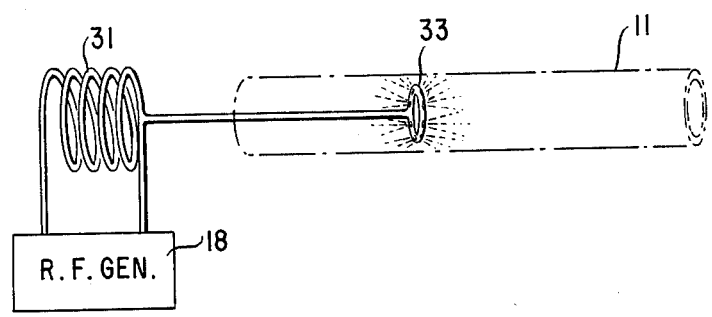
FIG. 3 is a schematic representation of direct plasma deposition, as in FIG. 2, where the plasma is injected by means of a ring nozzle.

The apparatus shown in FIG. 2 is essentially identical to that in FIG. 1 except for the coil configuration and the method of coupling the rf energy into the plasma. In this configuration, the rf coil 31 is provided with a terminous 32 from which the plasma is ejected. Techniques for so producing a plasma are described in U.S. Pat. Nos. 3,648,015; 3,872,279; and 3,894,209 which are incorporated into this application by reference. The terminous may be a single nozzle as shown in FIG. 2 or may be a ring nozzle, 33, as shown in FIG. 3.

EXAMPLE 1

A glass fiber for use in transmitting optical radiation was fabricated using the rf plasma MCVD deposition technique. A starting tube of 25 mm ID and 1.5 mm wall thickness was placed in a standard glass lathe. The tube material was fused quartz. A four-turn solenoid-shaped coil was placed around the tube and connected to an rf generator. The coil was mounted on a movable table capable of traversing the tube. The frequency of the electromagnetic energy was $4.5 \pm 0.5$ MHz and the power was $17.5 \pm 2.5$ KW. The plasma was supported using a mixture of Ar and O gas with the Ar flowing at 1050 cc/minute and the O flowing at 450 cc/minute. The temperature within similar plasmas has been measured to be approximately 20,000 degrees K at the center. The reactant gases were introduced into the tube by bubbling oxygen through $SiCl_4$, $GeCl_4$, at flow rates of 280 cc/min and 530 cc/min respectively. Gaseous $BCl_3$ was introduced directly into the tube at a flow rate of 8 cc/minute. The tube was rotated at speeds of up to 120 rpm during deposition. The coil traversed the tube at 1 cm/second. Glass was deposited over a 25 cm length of the tube at a rate of five microns per minute. Subsequent to deposition, the preform was collapsed using an oxygen-hydrogen burner, and drawn using a furnace-drawing apparatus. In this manner a 1 km length of 100 micron OD fiber with 35 micron core and less than 10 dB/km loss of 1.06 microns was produced. The material deposition rate using the above process was found to be a factor of 10 to 300 times more rapid than the normal CVD process, and a factor of 3 more rapid than the conventional modified CVD process alluded to above.

What is claimed is:

1. A process for fabrication of a glass fiber optical transmission line comprising a core section and a cladding wherein the cladding has an index of refraction of a value lower than the maximum index of the core for energy of the wavelength to be transmitted, comprising introducing a moving stream of vapor mixture including at least one compound glass-forming precursor together with an oxidizing medium into a tube; heating the tube by means of a moving hot zone so as to react the said mixture and produce a glassy deposit on the inner surface of the tube, said hot zone produced by a correspondingly moving heat source external to the tube, the temperature within the hot zone, composition of the vapor mixture, and rate of introduction of the mixture, such that at least a part of the reaction takes place within the gaseous mixture at a position spaced from the inner walls of the said tube, thereby producing a suspension of oxidic reaction product particulate material whereby the particulate material while traveling downstream comes to rest on the inner surface of the tube, and is fused to form a continuous glassy deposit within a region which extends from a position within the said hot zone; the invention characterized in that the moving hot zone is an rf plasma and the moving external heat source is an rf source.

2. The method of claim 1 wherein the rf source is an rf coil.

3. The method of claim 2 wherein the electromagnetic energy produced by the rf coil is inductively coupled into the rf plasma.

4. The method of claim 2 wherein the rf coil surrounds and is approximately concentric with the tube.

5. The method of claim 2 wherein the coil is used to produce an electron beam torch which inserts the plasma directly into the tube.

6. The method of claim 1 wherein the pressure within the tube is greater than that of the ambient surroundings during the deposition.

7. The process of claim 1 wherein the particulate material is fused to form a continuous glassy deposit by means of a second heat source.

8. The method of claim 1 wherein successive layers of material of different composition are deposited.

9. The method of claim 1 wherein the frequency is between 1 KHz and 100 MHz.

10. The method of claim 1 wherein the plasma is confined by a magnetic field.

* * * * *